United States Patent
Tarabbia et al.

(10) Patent No.: US 6,351,020 B1
(45) Date of Patent: Feb. 26, 2002

(54) LINEAR CAPACITOR STRUCTURE IN A CMOS PROCESS

(75) Inventors: Marc L. Tarabbia; Joseph Y. Chan; Geoffrey B. Hall, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/438,618

(22) Filed: Nov. 12, 1999

(51) Int. Cl.[7] .............................................. H01L 29/00
(52) U.S. Cl. ..................... 257/532; 275/307; 275/595
(58) Field of Search ............................... 257/307, 595, 257/532, 296, 300, 303; 361/271, 278, 328–329; 438/957

(56) References Cited

U.S. PATENT DOCUMENTS

| | | | |
|---|---|---|---|
| 4,244,000 A | * 1/1981 | Ueda | 357/39 |
| 5,841,334 A | * 11/1998 | East | 334/55 |
| 6,063,659 A | * 5/2000 | Le | 438/250 |
| 6,159,819 A | * 12/2000 | Tsai | 438/349 |

* cited by examiner

Primary Examiner—Olik Chaudhuri
Assistant Examiner—Nathan W. Ha
(74) Attorney, Agent, or Firm—James L. Clingan, Jr.

(57) ABSTRACT

A cumulative capacitor structure with desirably constant capacitance characteristics is disclosed. In one embodiment, the cumulative capacitor includes a set of four capacitors coupled in parallel between first and second terminals of the cumulative capacitor. In one embodiment, the first capacitor is comprised of a top plate formed of an n-type polysilicon coupled to the first terminal, a bottom plate comprised of a first accumulation/depletion region such as an n-well region coupled to the second terminal, and a first dielectric region between its top and bottom plates. The second capacitor has an n-type polysilicon terminal top plate coupled to the second terminal, an accumulation/depletion region bottom plate coupled to the first terminal, and a dielectric between its top and bottom plate. A third capacitor has a p-type polysilicon top plate coupled to the first terminal, an accumulation/depletion region bottom plate coupled to the second terminal, and a third dielectric region between its top and bottom plates. The fourth capacitor has a p-type polysilicon terminal coupled to the second terminal, an accumulation/depletion region bottom plate coupled to the first terminal, and a dielectric between its top and bottom plates.

15 Claims, 4 Drawing Sheets

US 6,351,020 B1

LINEAR CAPACITOR STRUCTURE IN A CMOS PROCESS

FIELD OF THE INVENTION

The invention is related to the field of semiconductor devices and more particularly to substantially linear semiconductor capacitors produced with a fabrication process primarily designed for CMOS logic.

BACKGROUND OF THE INVENTION

Mixed signal devices utilizing both analog and digital circuits frequently require linear capacitors for use in the analog circuitry. Typically, the integration of a process suitable for manufacturing these capacitors with an otherwise conventional, digital CMOS fabrication process has introduced additional cost and/or complexity into the fabrication process or has resulted in capacitors that lack the desired linearity over a sufficient range of biasing conditions. As an example, linear capacitors have been fabricated using two polysilicon deposition steps (double poly processes) in which polysilicon comprises both plates of the capacitor. While double poly processes are capable of producing adequate capacitors, most baseline CMOS fabrication processes must be modified to produce the second poly structure needed for the capacitor. The addition of this second poly structure and the corresponding deposition, mask, and etch steps required undesirably add cost, complexity, and cycle time to the corresponding process. Metal/metal capacitors, in which a pair of deposited metal layer separated by an interlevel dielectric form the capacitor, have also been investigated. In one example, the metal/metal capacitor is fully integrated into the backend of an existing fabrication process such that the existing metal and oxide deposition steps are used to produce the capacitor. Unfortunately, the use of existing metal structures in conjunction with the thick interlevel dielectrics characteristic of contemporary fabrication processes results in large area and typically imprecise capacitors. Moreover, while it would be desirable to utilize a high permittivity dielectric for the capacitor to obtain the greatest capacitance possible for a given capacitor plate area, the trend in the industry is to utilize low permittivity dielectrics for interlevel dielectrics to reduce coupling between successive metal layers. Other metal/metal capacitors have been proposed using tantalum (Ta) or tantalum nitride (TaN) plates, but Ta or TaN capacitors introduce multiple additional deposition and masking steps that increase the cost of the process. Therefore, it is highly desirable to implement a semiconductor process suitable for fabricating reliable and linear capacitors that can be integrated into an existing or baseline CMOS fabrication process without adding cost in the form of additional processing.

BRIEF DESCRIPTION OF THE DRAWING

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
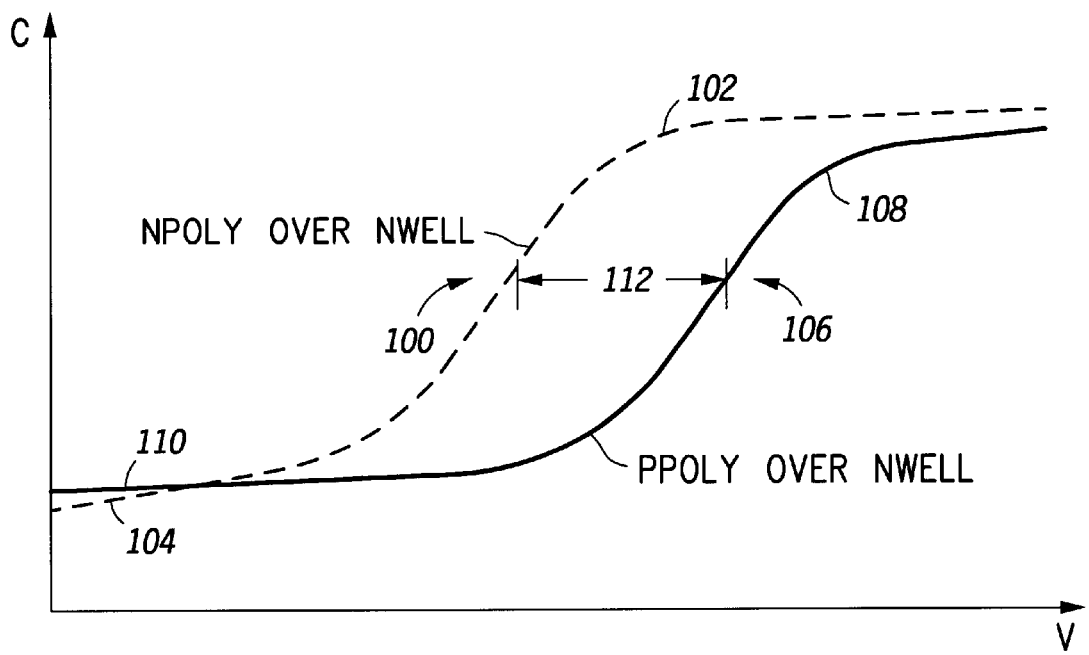
FIG. 1 is a graph indicating capacitance as a function of capacitor bias for n-poly and p-poly capacitors.

Turning now to FIG. 1, a graph indicating capacitance as a function of applied voltage is presented for two semiconductor capacitor structures. Both structures utilize an n-doped active area region of the silicon substrate (such as the n-well) for a first plate (the bottom plate) of the capacitor, a doped polysilicon (poly) structure as a second capacitor plate (the top plate), and an intermediate oxide or other dielectric layer as the capacitor dielectric. The first curve 100 indicates capacitance as a function of the voltage applied to the top plate (the bottom plate being grounded) for a capacitor in which the top plate comprises n-type polysilicon (referred to herein as an n-type capacitor) while second curve 106 represents the capacitance characteristics of a capacitor utilizing p-type poly for the top plate (a p-type capacitor). For the n-type capacitor corresponding to first curve 100, the onset of the accumulation region (indicated by reference numeral 102) where the capacitance is greatest is achieved at a lower voltage then the onset of accumulation (indicated by reference numeral 108) for the p-type capacitor of curve 106. Similarly, the depletion region 104 for the n-type capacitor requires a more negative voltage than the depletion region 110 for the p-type capacitor. The delta shift (indicated by reference numeral 112) between first curve 101 and second curve 106 is a function of the work function difference between the p-poly used for the p-type capacitor and the n-poly used for the n-type capacitor. Typically, both the p-type and n-type poly are heavily doped such that the work function difference is essentially the same as the band gap of the polysilicon which is in the range of approximately 1.1 volts. It will be appreciated that mirror image curves for curves 100 and 106 could be obtained by simply reversing the polarity of the applied bias. The present invention contemplates beneficially utilizing the delta 112 between first curve 100 and second curve 106 and their corresponding mirror image curves to achieve a cumulative capacitor structure with highly linear characteristics over a desired range of operating voltages.

Figure 2:
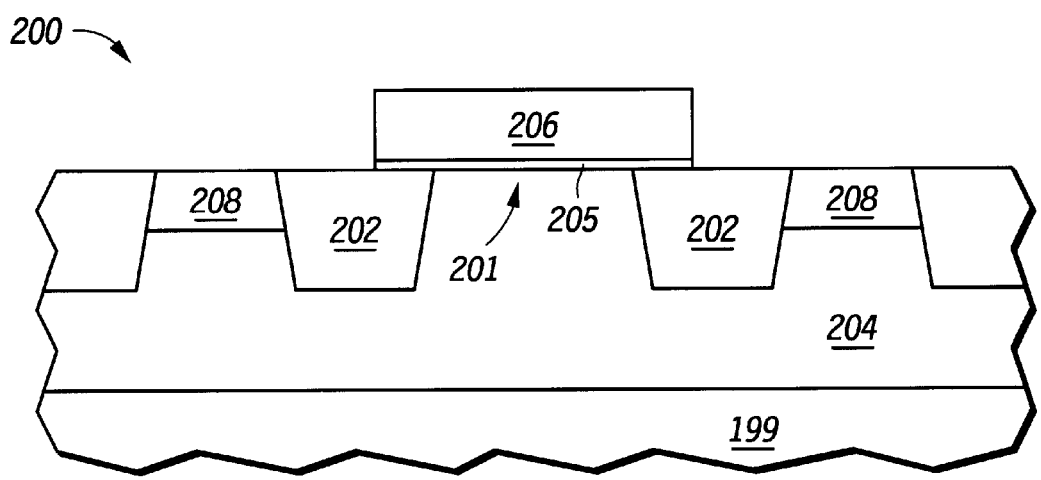
FIG. 2 is a partial cross-sectional view of an n-poly capacitor according to one embodiment of the present invention.

Turning now to FIG. 2, a partial cross-sectional view of an n-type capacitor 200 is presented. Capacitor 200 is a semiconductor capacitor preferably fabricated on a single crystal silicon substrate 199. In one embodiment useful in a wide variety of manufacturing processes, silicon substrate 199 is doped with a p-type impurity. An n-doped well region 204 is then formed over substrate 199 through conventional processes well known in the field of semiconductor fabrication. A bottom plate 201 of capacitor 200 comprises an active portion of the silicon, namely, the n-well region 204. The boundaries of bottom plate 201 in the depicted embodiment are defined by the boundaries of isolation dielectric structure 202. Isolation dielectric 202 may comprise shallow trench isolation (STI) structures well known in the field. In other embodiments, LOCOS isolation as well as any of a variety of known isolation processes may be used to form isolation dielectric structure 202. The potential of n-well region 204 (and thus bottom plate 201) is controlled by applying the desired voltage to an n+ region 208. The n+ region 208 comprises a heavily doped (i.e., in excess of approximately $10^{19}$ dopants/cm$^3$) portion of n-well 204 and is suitable for making a low resistance contact to a subsequently formed metal structure (not shown). A top plate 206 of capacitor 200 is displaced from n-well region 204 by an intermediate capacitor dielectric 205. In one embodiment, capacitor dielectric 205 is formed during the gate oxide formation of a conventional MOS process. In this embodiment, capacitor dielectric 205 typically comprises a thermally formed silicon dioxide film with a thickness in the range of approximately 3 to 20 nanometers. Top plate 206 of n-type capacitor 200 comprises heavily doped n-type polysilicon. In one embodiment, top plate 206 is fabricated during the gate formation of a CMOS process. In this embodiment, top plate 206 is fabricated using a conventional polysilicon deposition process in which silane (SiH$_4$) is thermally decomposed in a CVD reactor. Preferably, the thickness of top plate structure 206 is sufficient to prevent subsequently implanted impurities from penetrating through top plate structure 206 and capacitor dielectric 205 and into n-well region 204. In one embodiment, for example, the thickness of top plate 206 is in excess of approximately 100 nanometers. After appropriate mask and etch steps used to define the poly film (and expose portion of the underlying n-well region 204), n+ regions 208 are formed by implanting an n-type impurity such as arsenic or phosphorous. During the implant of n+ regions 208, the top plate structure 206 is simultaneously doped with the n-type impurity as desired. In the preferred embodiment, the implant of n+ regions 208 and the implant the n+ source/drain regions of the NMOS transistors of the baseline CMOS process are achieved simultaneously with a single implant step. Thus, in the preferred embodiment, the fabrication of capacitor 200 is achieved using the existing process steps of a baseline CMOS process such that capacitor 200 requires no processing steps in addition to the steps of the baseline process.

Figure 3:
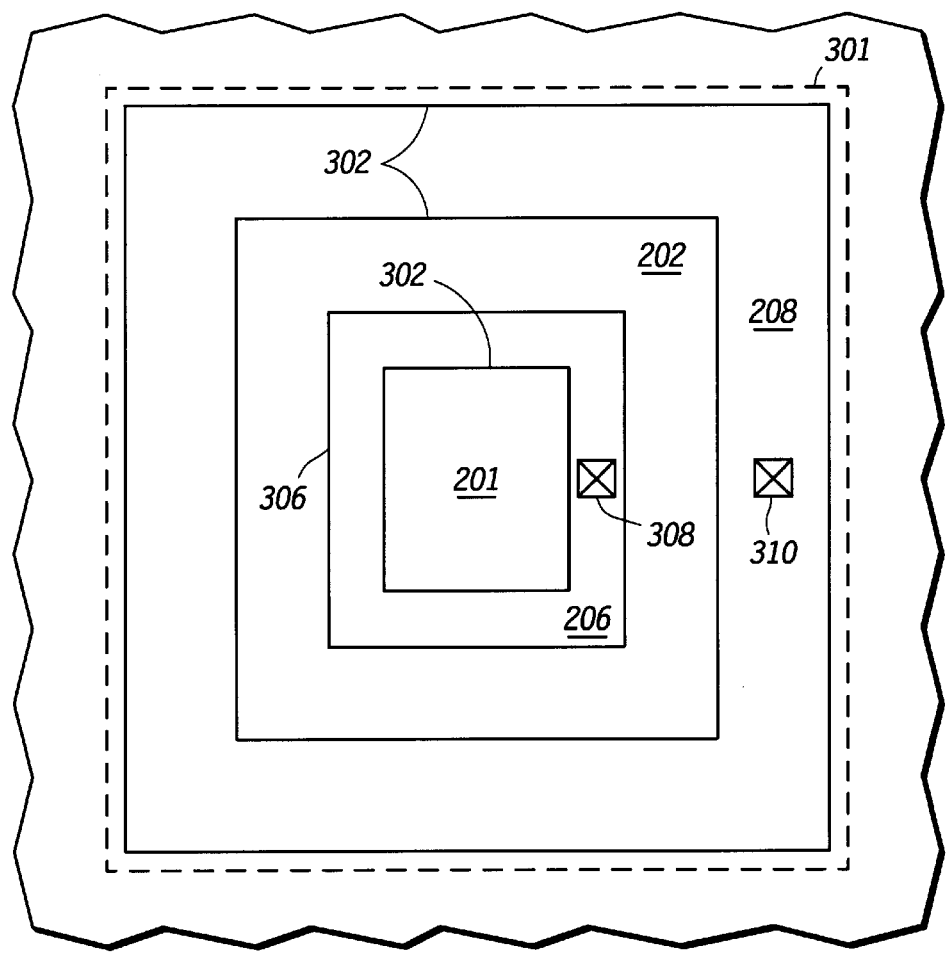
FIG. 3 is a partial top plan view of the capacitor of FIG. 2.

Turning now to FIG. 3, a top plan view of capacitor 200 is shown in which the individual elements of capacitor 200 are indicated relative to their associated masks. Mask 301 defines the region of substrate 199 that will receive an n-type implant of sufficient dose to form n-well region 204. Mask 302 defines the boundaries for isolation dielectrics 202 and, simultaneously, the boundaries for heavily doped regions 208 and bottom plate 201. Finally, mask 306 defines the boundaries for top plate 206 of capacitor 200. In the depicted embodiment, in which top plate 206 extends over the isolation dielectric structure 202 on all sides, the effective area of the capacitor 200 is defined solely by mask 302. In this embodiment, variations in processing parameters such as variations in the dimensions of polysilicon features due to photolithography and etch process variations do not result in an alteration of the effective area of the capacitors. FIG. 3 further shows the placement of contacts 308 and 310 for making contacts to top plate 206 of capacitor 200 and active region 208 respectively. In one embodiment, contacts 308 and 310 are formed simultaneously with a single mask and etch process.

Figure 4:
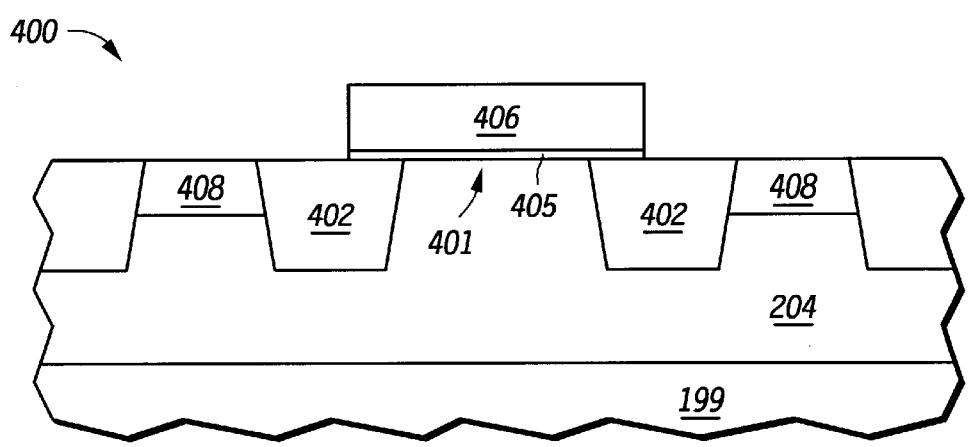
FIG. 4 is a partial cross-sectional view of a p-poly capacitor over n-well according to one embodiment of the invention.
Figure 5:
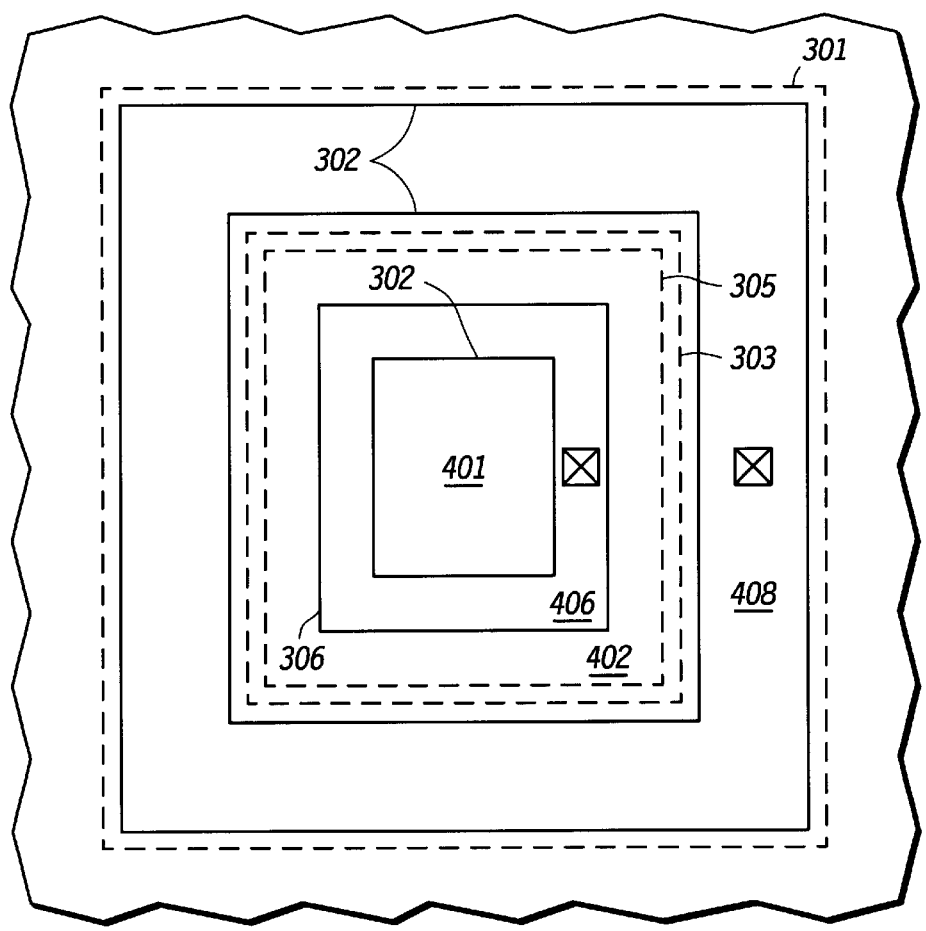
FIG. 5 is a partial top plan view of the capacitor of FIG. 4.

Turning now to FIGS. 4 and 5, a partial cross-sectional view and a partial top-plan view of a p-type capacitor 400 are shown. The p-type capacitor 400 is similar to n-type capacitor 200 in many respects. Accordingly, like n-type capacitor 200, p-type capacitor 400 includes an n-type well 204 including a bottom plate 401 defined by the boundaries of a surrounding isolation dielectric 402, heavily doped contact regions 408, and a capacitor dielectric 405, which are all analogous to the corresponding components of n-type capacitor 200. Unlike top plate 206 of n-type capacitor 200, however, top plate 406 of p-type capacitor 400 is heavily doped with a p-type impurity such as boron or BF$_2$. FIG. 5 indicates the masks used to form the p-type capacitor 400 of FIG. 4. Like the masks shown in FIG. 3 with respect to n-type capacitor 200, the masks used to fabricate p-type capacitor 400 of FIG. 4 include an n-well mask 301 defining the area for n-well region 204, a mask 302 defining the boundaries of isolation dielectric structure 202, and a poly mask 306 defining the boundaries for top plate structure 406. To achieve a p-type top plate 406, a mask 305 is used to define the boundaries for a p+ implant. The p+ implant used to dope top plate structure 406 of p-type capacitor 400 is, in the preferred embodiment, the same mask step used to define the p+ regions for PMOS transistors (not shown) in the baseline CMOS process. FIG. 5 further shows an n+ mask 305 used to define regions for implanting n+ active region 408. In the preferred embodiment, the n+ implant used for n+ regions 408 of p-type capacitor 400 is the same mask used to define n+ regions 208 of n-type capacitor 200.

Figure 6:
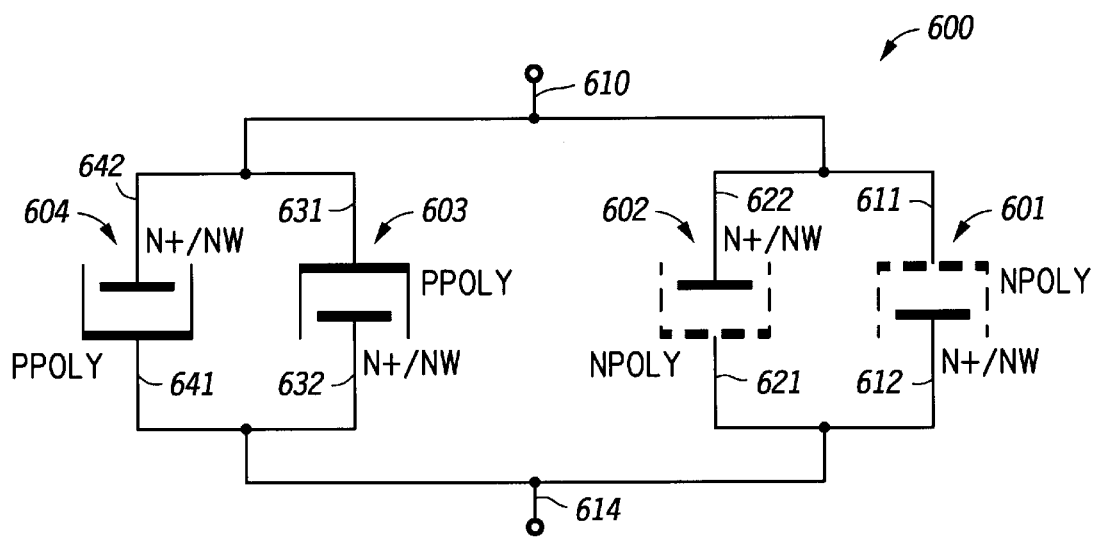
FIG. 6 is a circuit diagram of a cumulative capacitor according to one embodiment of the invention.
Figure 7:
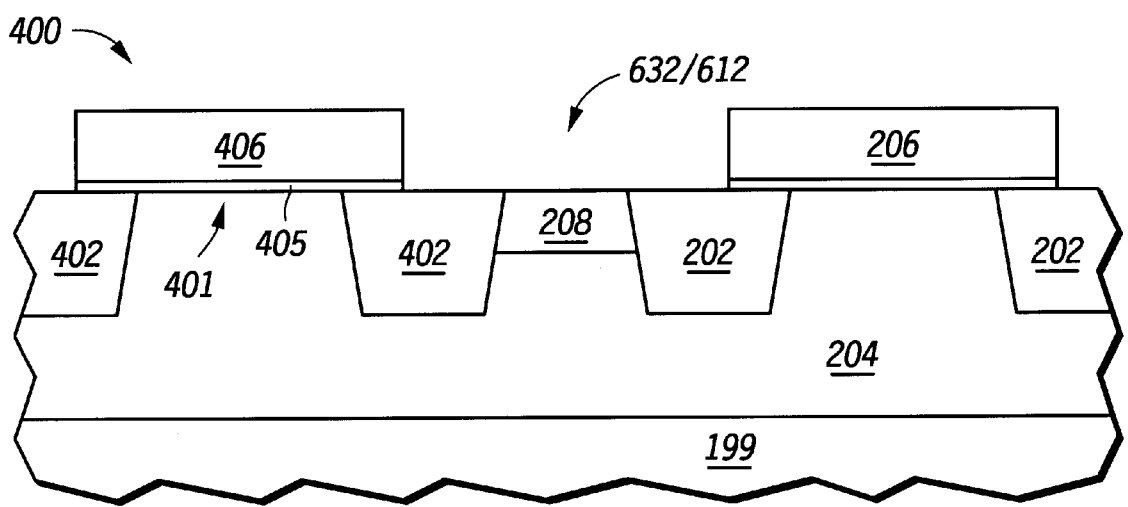
FIG. 7 is a cross section of a pair of capacitors according to an alternate embodiment of the invention.

Turning now to FIG. 6, n-type capacitor 200 and p-type capacitor 400 are combined to form a cumulative capacitor 600 according to one embodiment of the present invention. Cumulative capacitor 600 includes a first capacitor 601 with an n-type polysilicon terminal 611 coupled to a first terminal 610 of cumulative capacitor 600. The active area (i.e., n-well) terminal 612 of first capacitor 601 is coupled to a second terminal 614 of cumulative capacitor 600. Cumulative capacitor 600 further includes a second capacitor 602 with an n-type polysilicon terminal 621 connected to second terminal 614 and an active area terminal 622 connected to first terminal 610. The depicted embodiment of cumulative capacitor 600 further includes a third capacitor 603 with a p-type polysilicon terminal 631 connected to first terminal 610 and an active area terminal 632 connected to second terminal 614. Finally, cumulative capacitor 600 includes a fourth capacitor 604 with a p-type polysilicon terminal 641 connected to second terminal 614 and an active area terminal 642 connected to first terminal 610. In one embodiment, first and second capacitors 601 and 602 comprise n-type capacitors 200 as disclosed herein while third and fourth capacitors 603 and 604 are p-type capacitors 400.

In one embodiment, each capacitor 601, 602, 603, and 604 is fabricated in a dedicated well to which the active area terminal is connected. In another embodiment, a common well can be used for the active area terminals 622 and 642 of second capacitor 602 and fourth capacitor 604. Similarly, a common well can be used for the active area connection 632 and 612 of first capacitor 601 and third capacitor 603. By using a common well connection, additional savings in the area required to fabricate cumulative capacitor 600 may be achieved. In one embodiment, the active area terminals of each of the capacitors in cumulative capacitor 600 are connected to their corresponding terminals of cumulative capacitor 600 through an intermediate n+ region identified by reference numerals 208 and 408 in FIGS. 2 and 4. It will be appreciated that by applying an appropriate bias to top plate 206 and 406 of the respective capacitors 200 and 400, bottom plates 201 and 401 of each capacitor may be driven to an accumulation or depletion state. From this perspective, bottom regions 201 and 401 may be thought of as comprising accumulation/depletion regions which are manipulated by applying the appropriate bias to first plates 206 and 406 respectively. By manipulating the accumulation/depletion mode of these accumulation/depletion regions, the effective capacitance of the corresponding structure may be controlled. Referring back to FIG. 1, it will be appreciated that when n-type capacitor 200 is biased to accumulation mode 102, the effective capacitance of n-type capacitor 200 is greater than the capacitance when n-type capacitor 200 is biased to depletion mode indicated by reference numeral 104. Similarly, biasing p-type capacitor 400 to accumulation mode indicated by reference numeral 108 results in a greater effective capacitance than the capacitance when p-type capacitor 400 is biased to depletion mode. The back-to-back or symmetrical arrangement of the pair of n-type capacitors 601 and 602 results in opposite biasing of the two capacitors such that when the capacitance of capacitor 601 is increased, the capacitance of capacitor 602 is decreased. The same can be said for the pair of p-type capacitors 603 and 604. The symmetrical arrangement of the capacitors is utilized in cumulative capacitor 600 in conjunction with the delta 112 in work function between p-type capacitors 603 and 604 and n-type capacitors 601 and 602 to achieve a cumulative capacitor 600 with substantially linear capacitance characteristics over a range of operating voltages. In the absence of a p-type capacitor such as capacitors 603 and 604, a cumulative capacitor 600 comprised only of symmetrically coupled n-type capacitors 601 and 602 would produce a cumulative capacitance characteristic substantially more linear than the capacitance characteristics of a single n-type capacitor as shown in FIG. 1 but with a substantial variation in capacitance in the vicinity of zero bias voltage conditions. More specifically, the overall capacitance of a pair of symmetrically coupled n-type capacitors would include a capacitance peak in the vicinity of zero volt biasing. Similarly, a symmetrically paired combination of p-type capacitors 603 and 604 would result in a cumulative capacitor with a capacitance "trough" in the neighborhood of zero volts. By combining pairs of symmetrically arranged p-type capacitors and n-type capacitors as indicated in FIG. 6, a cumulative capacitor 600 may be fabricated with substantially linear capacitance characteristics over a voltage range extending from a negative bias to a positive bias. Although the depicted embodiment of cumulative capacitor 600 is shown in connection with a fabrication process that utilizes a p-type substrate and an n-type well, it will be appreciated that the invention may be suitably implemented in a process that uses an n-type substrate wafer and p-type wells as well.

In one embodiment of the invention, each of the capacitors 601, 602, 603, and 604 utilize an active region 204 with a common cross-sectional area. In another embodiment, the capacitor areas of each capacitor are optimized to produce a minimum variation in overall capacitance over the range of operating voltages. The optimization of the capacitance variation is suitably achieved through the use of an analytical equation for approximating the capacitance of each capacitor in cumulative capacitor 600. The analytical equation approximates the capacitance as a function of the voltage applied to the corresponding capacitor. The overall capacitance of cumulative capacitor 600 is achieved by summing the individual capacitances of the four component capacitors. The area of each capacitor may be introduced into the analytical equation as a variable that is used to control the contribution to the overall capacitance of cumulative capacitor 600 that is made by each individual capacitor. The linearity of cumulative capacitor 600 may then be optimized by minimizing variation in the cumulative capacitance by varying the relative areas of the component capacitors using any of a number of conventional minimization routines. In this manner, the invention provides the ability to optimize the linearity of the capacitor 600 over a wide range of voltages or, in another embodiment, over a specific range of voltages.

While the depicted embodiment of cumulative capacitor 600 shown in FIG. 6 includes four capacitors, it will be appreciated that additional capacitors may be added to provide further control over the linearity characteristics of capacitor 600. In addition, other embodiments of the invention contemplate the use of fewer than four capacitors. In one embodiment, for example, cumulative capacitor 600 may include a pair of symmetrically connected n-type capacitors coupled in parallel with a p-type capacitor. A cumulative capacitor of this type may provide sufficient linearity over a relatively narrower range of operating voltages while simultaneously consuming less area of the integrated circuit. Another embodiment of the invention contemplates a p-type capacitor and an n-type capacitor in which the polysilicon terminals of each capacitor are tied together and the well plates of each capacitor are tied together. A cumulative capacitor of this type might suitably be used as a varactor in which the capacitance characteristic of the structure may be controlled by appropriate biasing. By coupling the p-type capacitor in parallel with the n-type capacitor in this fashion, a more controllable varactor in which the slope of the change in capacitance as a function of a change in voltage is less severe than the varactor characteristics of a single capacitor. The configuration of such a varactor would resemble the cumulative capacitor 600 of FIG. 6 after removing first and third capacitors 601 and 603. Alternatively, the varactor may be achieved by removing capacitors 604 and 602 from cumulative capacitor 600 as shown in FIG. 6.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

We claim:

1. A cumulative capacitor having a first cumulative capacitor terminal and a second cumulative capacitor terminal comprising:

a first capacitor having an n-type polysilicon terminal coupled to the first cumulative capacitor terminal and an active area terminal coupled to the second cumulative capacitor terminal;

a second capacitor having an n-type polysilicon terminal coupled to the second cumulative capacitor terminal and an active area terminal coupled to the first cumulative capacitor terminal;

a third capacitor having a p-type polysilicon terminal coupled to the first cumulative capacitor terminal and an active area terminal coupled to the second cumulative capacitor terminal; and a fourth capacitor having a p-type polysilicon terminal coupled to the second cumulative capacitor terminal and an active area terminal coupled to the first cumulative capacitor terminal.

2. The cumulative capacitor of claim 1, further comprising first, second, third, and fourth wells containing the active area terminals of the first, second, third, and fourth capacitors, respectively.

3. The cumulative capacitor of claim 1, further comprising a first well containing the active area terminals of the first and third capacitors.

4. The cumulative capacitor of claim 3, wherein the active area terminals of the first and third capacitors are coupled to the second cumulative capacitor terminal through an N+ region.

5. A cumulative capacitor comprising:

a first capacitor having a first polysilicon terminal doped to n-type, a first accumulation/depletion region, and a first dielectric region between the first polysilicon terminal and the first accumulation/depletion region;

a second capacitor having a second polysilicon terminal doped to n-type coupled to the first accumulation/depletion region, a second accumulation/depletion region coupled to the first polysilicon terminal, and a dielectric between the second polysilicon terminal and the second accumulation/depletion region, a third capacitor having a third polysilicon terminal doped to p-type coupled to the first polysilicon terminal, a third accumulation/depletion region coupled to the first accumulation/depletion region, and a third dielectric region between the third polysilicon terminal and the third accumulation/depletion region; and a fourth capacitor having a fourth polysilicon terminal doped to p-type coupled to the first accumulation/depletion region, a fourth accumulation/depletion region coupled to the first polysilicon terminal, and a dielectric between the fourth polysilicon terminal and the fourth accumulation/depletion region.

6. The cumulative capacitor of claim 5, wherein the first, second, third, and fourth capacitors are formed in first, second, third, and fourth n-type wells, respectively.

7. The cumulative capacitor of claim 6, further comprising first, second, third, and fourth N+ regions in the first, second, third, and fourth wells, respectively.

8. The cumulative capacitor of claim 7, wherein the first polysilicon terminal is coupled to the second accumulation/depletion region through the second N+ region.

9. The cumulative capacitor of claim 8, wherein the first polysilicon terminal is coupled to the fourth accumulation/depletion region through the fourth N+ region.

10. The cumulative capacitor of claim 9, wherein the first, second, third, and fourth polysilicon terminals have first, second, third, and fourth areas, respectively.

11. The cumulative capacitor of claim 10, wherein the first area is different from the second area.

12. The cumulative capacitor of claim 11, wherein the third area is different from the fourth area.

13. The cumulative capacitor of claim 10, wherein the first area is the same as the second area.

14. The cumulative capacitor of claim 13, wherein the third area is the same as fourth area.

15. A cumulative capacitor comprising:

a first capacitor having a first polysilicon terminal doped to n-type, a first accumulation/depletion region, and a first dielectric region between the first polysilicon terminal and the first accumulation depletion region; and a second capacitor having a second polysilicon terminal doped to p-type coupled to the first polysilicon terminal, a second accumulation/depletion region coupled to the first accumulation/depletion region, and a second dielectric region between the second polysilicon terminal and the second accumulation depletion region.

* * * * *